United States Patent
Mikami

(10) Patent No.: US 8,368,476 B2
(45) Date of Patent: Feb. 5, 2013

(54) RESONATOR ELEMENT, RESONATOR DEVICE AND ELECTRONIC DEVICE

(75) Inventor: Masaru Mikami, Minowa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 13/047,130

(22) Filed: Mar. 14, 2011

(65) Prior Publication Data

US 2011/0227660 A1 Sep. 22, 2011

(30) Foreign Application Priority Data

Mar. 19, 2010 (JP) .................................. 2010-063875
Jan. 14, 2011 (JP) .................................. 2011-005564

(51) Int. Cl.
*H03B 5/30* (2006.01)
*H01L 41/04* (2006.01)

(52) U.S. Cl. ............ 331/156; 331/68; 310/348; 310/370

(58) Field of Classification Search ............... 331/116 R, 331/116 FE, 116 M, 154, 156, 158, 159, 331/68–70, 108 C, 108 D; 310/318, 311, 310/344, 346, 348, 349, 351, 365–371; 29/25.35
See application file for complete search history.

(56) References Cited

U.S. PATENT DOCUMENTS

| | | | |
|---|---|---|---|
| 7,193,354 B2 | 3/2007 | Kawashima | |
| 7,834,526 B2 * | 11/2010 | Yamada | 310/367 |
| 8,018,127 B2 * | 9/2011 | Kikushima et al. | 310/370 |
| 8,110,965 B2 * | 2/2012 | Iwai et al. | 310/370 |
| 8,120,233 B2 * | 2/2012 | Umeki et al. | 310/370 |
| 2006/0162447 A1 * | 7/2006 | Ogura | 73/504.12 |
| 2006/0201248 A1 * | 9/2006 | Unno | 73/504.12 |
| 2009/0167118 A1 * | 7/2009 | Yoshimatsu et al. | 310/370 |
| 2009/0212668 A1 * | 8/2009 | Sugiyama | 310/370 |

FOREIGN PATENT DOCUMENTS

| | | |
|---|---|---|
| JP | 2005-005896 | 1/2005 |
| JP | 2005-39767 | 2/2005 |

* cited by examiner

*Primary Examiner* — Levi Gannon
(74) *Attorney, Agent, or Firm* — Harness, Dickey & Pierce, P.L.C.

(57) ABSTRACT

A resonator element includes: a base portion, a first resonating arm that is extended from the base portion along a first direction, and a second resonating arm that is extended from the base portion along a first direction opposite to the first resonating arm, wherein the first resonating arm and the second resonating arm are arranged such that a base end portion of one side resonating arm and a middle portion of the other side resonating arm are arranged in the second direction orthogonal to the first direction.

18 Claims, 10 Drawing Sheets

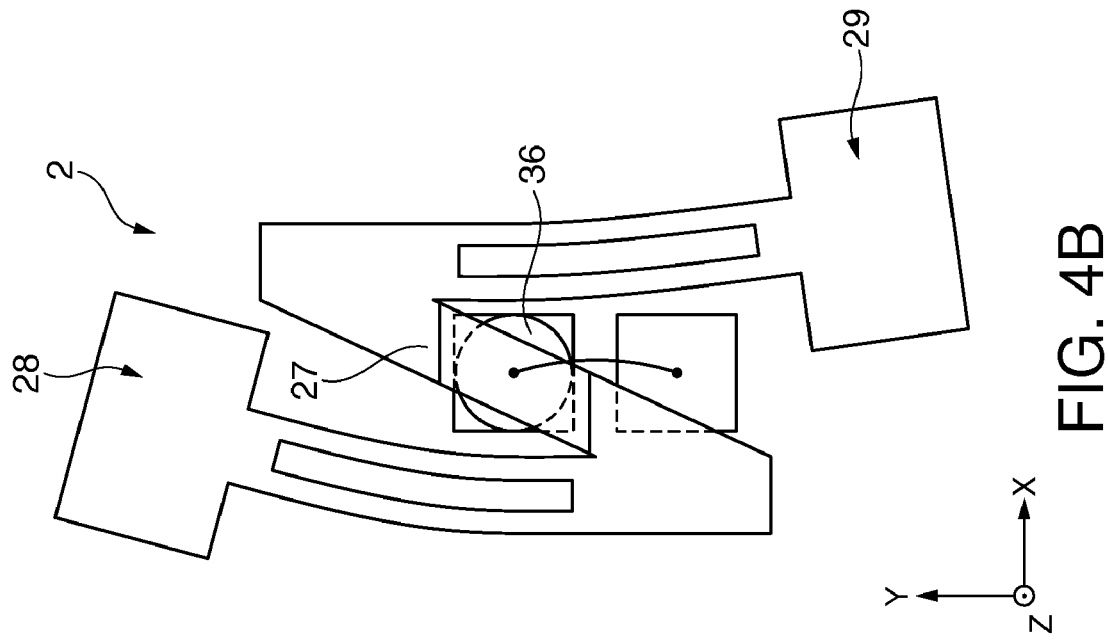
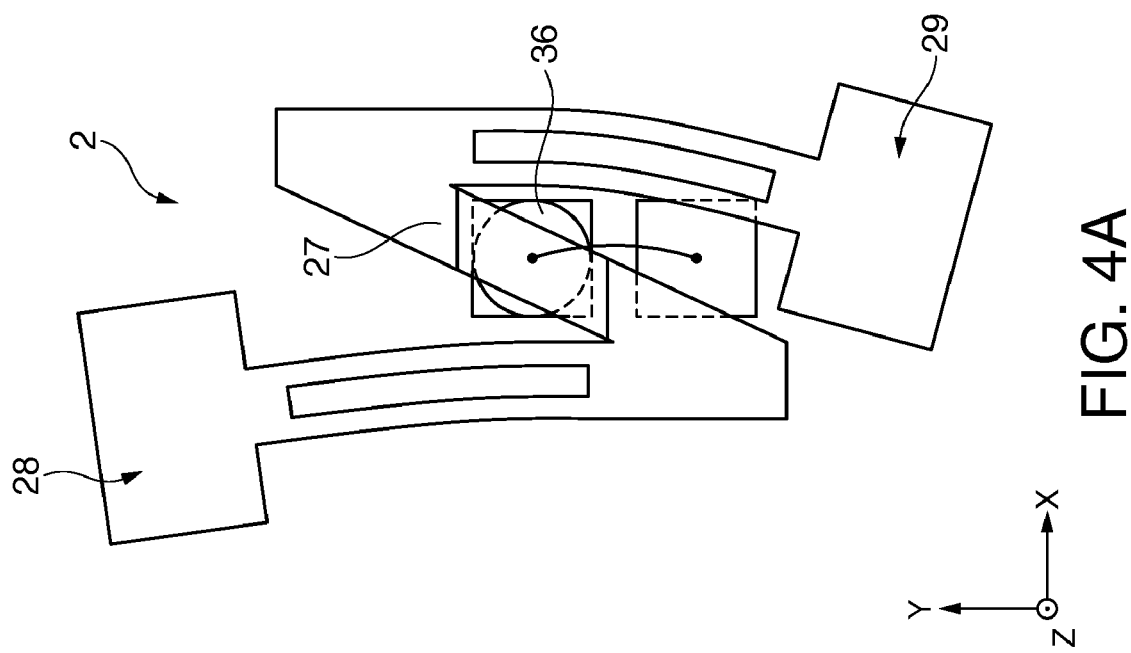

RESONATOR ELEMENT, RESONATOR DEVICE AND ELECTRONIC DEVICE

BACKGROUND

1. Technical Field

The present invention relates to a resonator element, a resonator device that uses the resonator element and an electronic device.

2. Related Art

As the resonator device such as a crystal oscillator, the resonator device includes a tuning-fork type resonator element that includes a plurality of resonating arms (for example, see JP-A-2005-39767).

For example, a resonator element described in JP-A-2005-39767 has a base portion and two resonating arms that are extended from the base portion so as to be parallel to each other. Thus, two resonating arms are vibrated in a flexural manner in parallel directions (a direction within a surface) opposed to each other.

In the resonator element disclosed in JP-A-2005-39767, the tip end portion of the resonating arm is widened and the weight of the tip end portion of the resonating arm becomes large. Accordingly, the length of the resonating arm can be short and the dimensions of the resonator element in the longitudinal direction can be decreased.

However, in the resonator element disclosed in JP-A-2005-39767, two resonating arms are extended in the same direction so as to be parallel to each other so that when the tip end portion of each of the resonating arms is widened as described above, the distance of the gap should be large enough that the two resonating arms do not collide with each other. Thus, the dimensions of the resonator element are large in the width direction of the resonating arms and as a result, there is a problem that miniaturization of the resonator element cannot be sufficiently performed.

SUMMARY

An advantage of some aspect of the invention is that it provides a resonator element, a resonator device and an electronic device that use the resonator element which can realize lower frequencies and a more compact size.

APPLICATION EXAMPLE 1

According to this application example of the invention, there is provided a resonator element including: a base portion, a first resonating arm that is extended from the base portion along a first direction, and a second resonating arm that is extended from the base portion along a first direction opposite to the first resonating arm, wherein the first resonating arm and the second resonating arm are arranged such that the base end portion of one side resonating arm and the middle portion of the other side resonating arm are arranged parallel with the second direction orthogonal to the first direction.

According to this configuration, the distance of the gap between the first resonating arm and the second resonating arm in the second direction can be suppressed and even though the tip end portions of the first resonating arm and the second resonating arm are widened respectively, impact of the first resonating arm and the second resonating arm can be prevented. As a result, the dimensions of the resonator element in the second direction can be suppressed.

Also, the first resonating arm and the second resonating arm are arranged in parallel to each other in the second direction so that the dimensions of the resonator element in the first direction can be prevented from increasing.

Furthermore, the resonator element can be supported and fixed near the center or center of gravity thereof. Thus, the mounting area of the resonator element can be smaller and also on this point, a more compact size can be realized.

Accordingly, the resonator element of the application can realize lower frequencies and a more compact size.

APPLICATION EXAMPLE 2

In the resonator element according to the application example it is preferable that a first mass portion of which the width is larger than that of the base end portion of the first resonating arm is arranged at the tip end portion of the first resonating arm and a second mass portion of which the width is larger than that of the base end portion of the second resonating arm is arranged at the tip end portion of the second resonating arm.

According to this configuration, the weights of the tip end portions of the first resonating arm and the second resonating arm can made larger respectively. As a result, the lengths of the first resonating arm and the second resonating arm can be suppressed respectively and the dimensions of the resonator element in the first direction can be suppressed. The vibration frequency of the first resonating arm and the second resonating arm can be lowered respectively.

APPLICATION EXAMPLE 3

In the resonator element according to the application example, it is preferable that the first mass portion is arranged at the tip end portion of the first resonating arm and the second mass portion is arranged at the tip end portion of the second resonating arm, and wherein the cross-sectional area of the first mass portion is larger than that of the base end portion of the first resonating arm and a cross-sectional area of the second mass portion is larger than that of the base end portion of the second resonating arm.

According to this configuration, the weights of the tip end portions of the first resonating arm and the second resonating arm can be increased respectively.

APPLICATION EXAMPLE 4

In the resonator element according to the application example, it is preferable that the first mass portion and the second mass portion have a long shape in which the second direction is the longitudinal direction.

According to this configuration, the lengths of the first resonating arm and the second resonating arm can be suppressed and the weights of the first mass portion and the second mass portion can be increased.

APPLICATION EXAMPLE 5

In the resonator element according to the application example, it is preferable that the first mass portion and the second mass portion are arranged such that both ends thereof are parallel to each other in the first direction.

According to this configuration, even though the widths of the first mass portion and the second mass portion are large respectively, the dimensions of the resonator element in the second direction can be suppressed.

APPLICATION EXAMPLE 6

In the resonator element according to the application example, it is preferable that the base portion has an elongated shape extending in a direction that has directional components of the first direction and the second direction respectively, wherein the first resonating arm is extended from the one end portion of the base portion, and wherein the second resonating arm is extended from the other end portion of the base portion.

According to this configuration, the dimensions of the base portion in the second direction can be suppressed and the first resonating arm and the second resonating arm can be extended from the base portion respectively.

APPLICATION EXAMPLE 7

In the resonator element according to the application example, it is preferable that the base portion has a main body portion, a first connection portion that is extended along the second direction from the one end portion of the main body portion in the first direction and a second connection portion that is extended along the second direction opposite to the first connection portion from the other end portion of the main body portion in the first direction, wherein the first resonating arm is extended from the first connection portion, and wherein the second resonating arm is extended from the second connection portion.

According to this configuration, influence of the shape of the base portion with respect to the vibration characteristic of the first resonating arm and the second resonating arm can be suppressed. Thus, the vibration characteristics of the resonator element can be excellent and design of the resonator element can be easily performed.

APPLICATION EXAMPLE 8

In the resonator element according to the application example, it is preferable that the first resonating arm and the second resonating arm are vibrated in a flexural manner in the second direction respectively.

According to this configuration, the resonator element having a small vibration leakage can be realized.

APPLICATION EXAMPLE 9

In the resonator element according to the application example, it is preferable that the first resonating arm and the second resonating arm are vibrated in a flexural manner in the same direction as each other.

According to this configuration, the vibration leakage can be further suppressed.

APPLICATION EXAMPLE 10

In the resonator element according to the application example, it is preferable that the base portion has a rotationally symmetrical shape, as seen from the third direction.

According to this configuration, the resonator element can be stably supported and fixed near the center of gravity thereof.

APPLICATION EXAMPLE 11

According to this application example of the invention, a resonator device including: the above-described resonator element and a package that accommodates the resonator element.

According to this configuration, the resonator device can realize lower frequencies and a more compact size.

APPLICATION EXAMPLE 12

According to this application example of the invention, a resonator device including: the above-described resonator element, a driving circuit portion that is electrically connected to the resonator element, and a package that accommodates the resonator element.

According to this configuration, the resonator device can realize lower frequencies and a more compact size.

APPLICATION EXAMPLE 13

According to this application example of the invention, an electronic device including: the above-described resonator element.

According to this configuration, the compact the electronic device can be easily provided, which uses the resonator device that can realize lower frequencies and a more compact size.

BRIEF DESCRIPTION OF THE DRAWINGS

The invention will be described with reference to the accompanying drawings, wherein like numbers reference like elements.

FIGS. 4A and 4B are top plan views illustrating a function of the resonator element shown FIG. 2.

DESCRIPTION OF EXEMPLARY EMBODIMENTS

Hereinafter, a resonator element, a resonator device and an electronic device using the resonator element and the resonator device according to the invention will be described based on embodiments illustrated in the attached drawings.

First Embodiment

Figure 1:
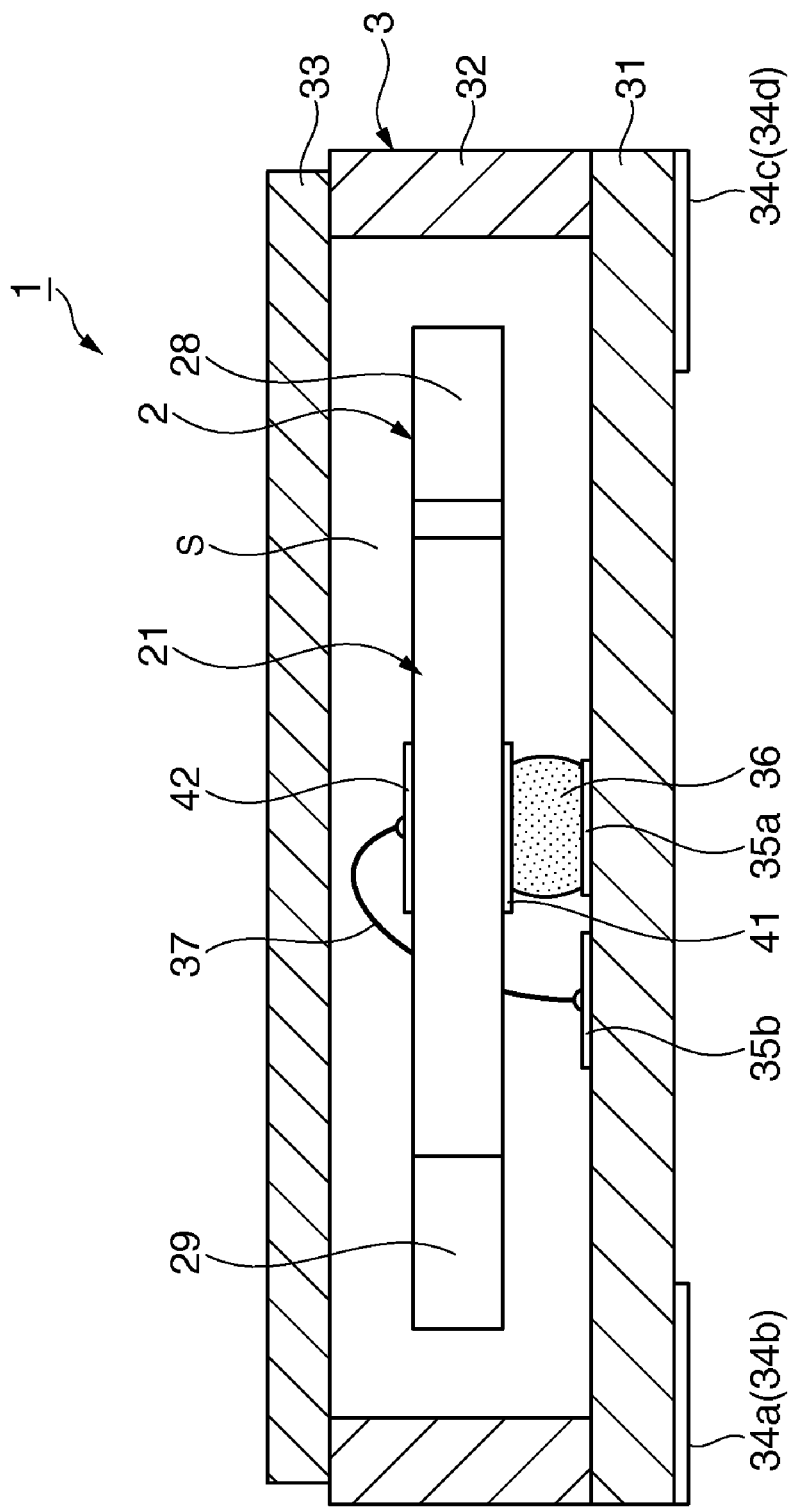
FIG. 1 is a cross-sectional view illustrating a resonator device of according to a first embodiment of the invention.
Figure 2:
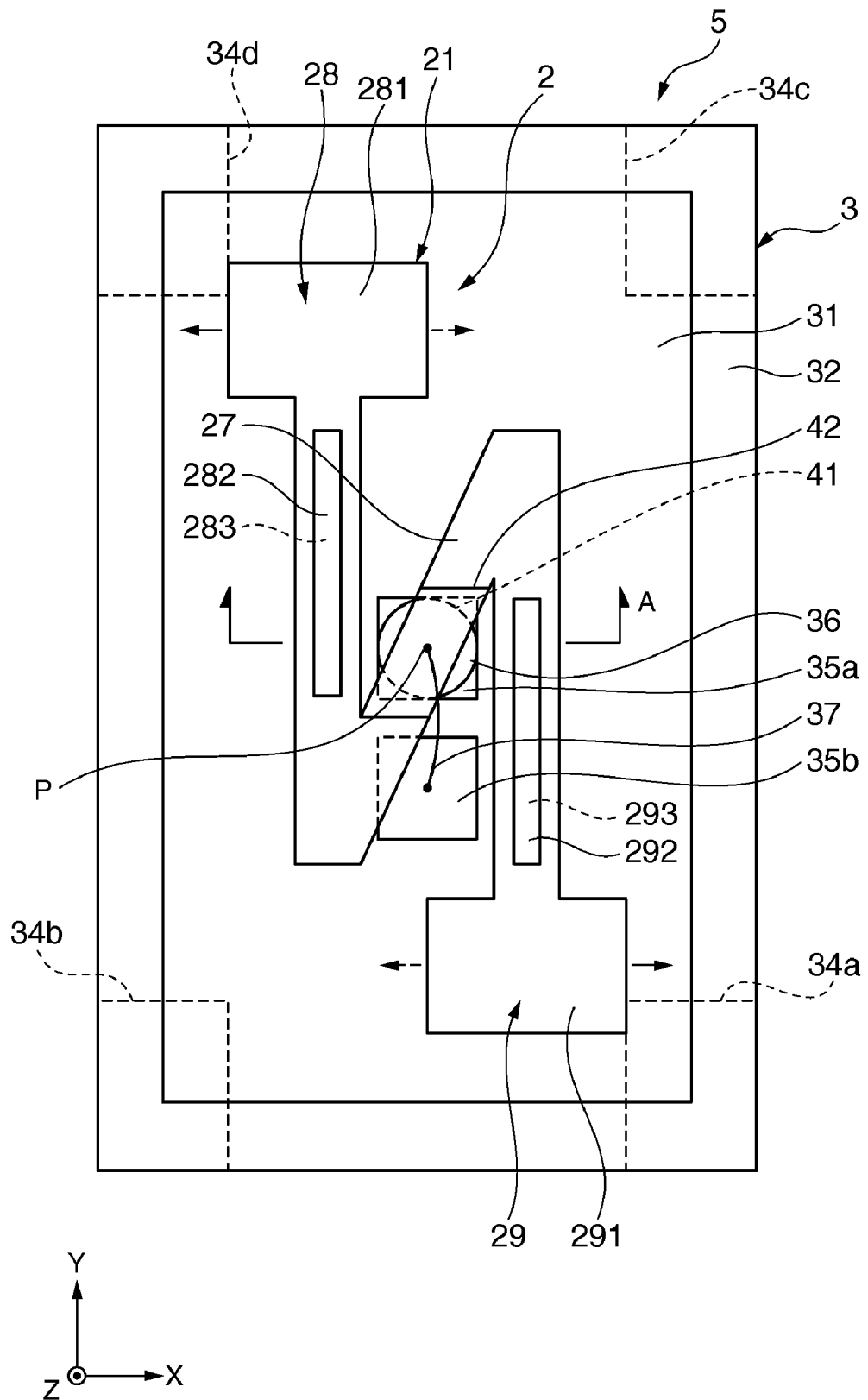
FIG. 2 is a top plan view illustrating the resonator device that is illustrated in FIG. 1.
Figure 3:
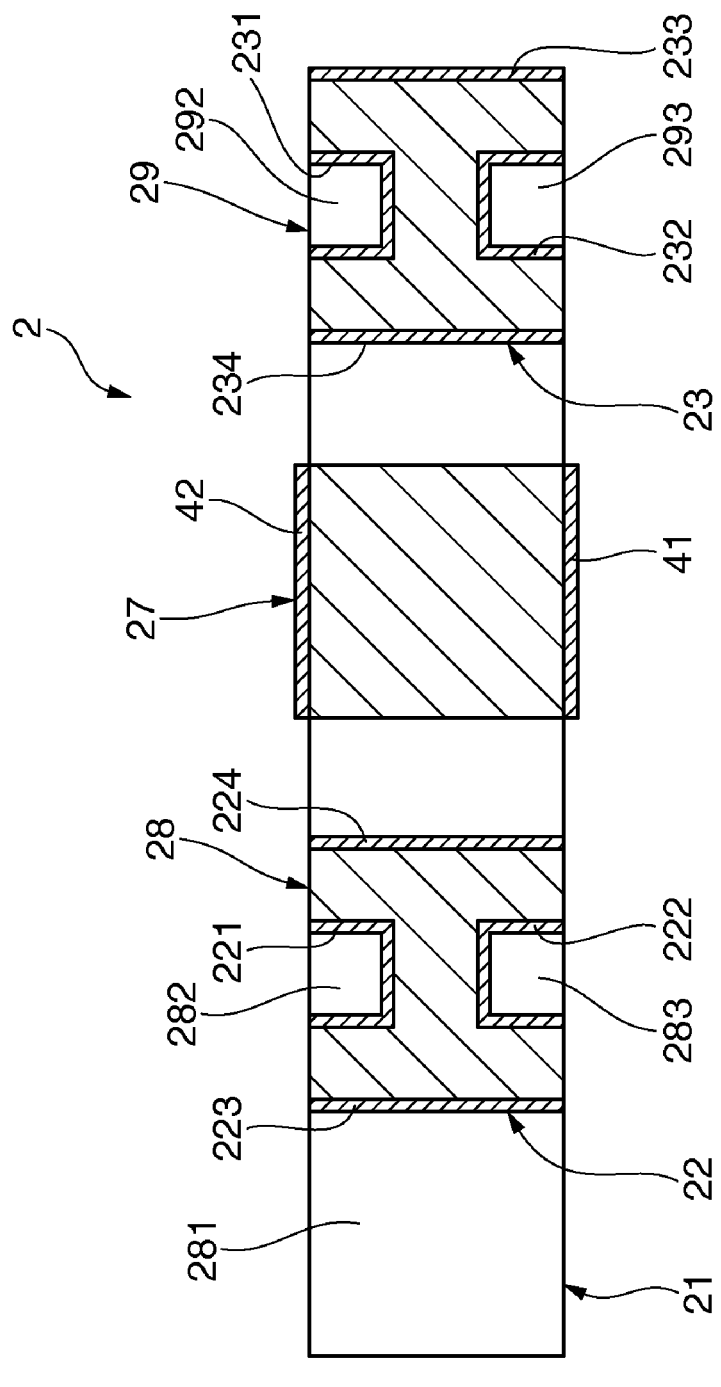
FIG. 3 is a cross-sectional view taken along line A-A in FIG. 2.

FIG. 1 is a cross-sectional view illustrating the resonator device of according to a first embodiment of the invention, FIG. 2 is a top plan view illustrating a resonator element included in the resonator device that is illustrated in FIG. 1, FIG. 3 is a cross-sectional view taken along line A-A in FIG. 2 and FIGS. 4A and 4B are top plan views illustrating a function of the resonator element shown in FIG. 2.

In each of FIGS. 1 to 4, for convenience sake of description, X-axis, Y-axis and Z-axis are illustrated as three axes orthogonal to each other. Hereinafter, a direction (a second direction) that is parallel to the X-axis is referred as the "X-axis direction", a direction (a first direction) that is parallel to the Y-axis is referred as the "Y-axis direction" and a direction (a third direction) that is parallel to the Z-axis is referred as the "Z-axis direction". Also, in the description below, for convenience of description, an upper side in FIG. 1 is referred as "upper", a lower side is referred as "lower", a right side is referred as "right" and a left side is referred as "left".

A resonator device 1 illustrated in FIG. 1 has a resonator element 2 and a package 3 in which the resonator element 2 is accommodated.

Hereinafter, each of the portions constituting the resonator device 1 is sequentially described in detail.

Vibrator Element

First of all, description will be given regarding the resonator element 2.

The resonator element 2 has a vibrating substrate 21 and connection electrodes 41 and 42 that are arranged on the vibrating substrate 21 as shown in FIGS. 1 and 2. Also, the resonator element 2 has excitation electrode groups 22 and 23 that are arranged on the vibrating substrate 21 as shown in FIG. 3. The excitation electrode groups 22 and 23 are not shown in FIGS. 1, 2 and 4.

The vibrating substrate 21 has a base portion 27 and two (a pair) resonating arms 28 and 29.

The vibrating substrate (the piezoelectric body substrate) 21 is constituted of a piezoelectric material.

For example, a crystal, lithium tantalite, lithium niobate, lithium borate, barium titanate or the like are used as examples of the piezoelectric material. Specifically, a crystal is preferred as the piezoelectric material constituting the vibrating substrate 21. When the vibrating substrate 21 is constituted by a crystal, the vibration characteristics of the vibrating substrate 21 can be excellent. Also, the vibrating substrate 21 can be formed with high dimensional precision by etching.

In such a vibrating substrate 21, the base portion has a long shape extending in a direction that has directional components in the X-axis direction and the Y-axis direction respectively.

The connection electrode 42 is arranged on the upper surface of the base portion 27 at the center portion in the longitudinal direction. Meanwhile, the connection electrode 41 is arranged on the lower surface of the base portion 27 at the center portion in the longitudinal direction. Thus, as described below, the center portion is fixed to a base substrate 31 of the package 3 through the conductive adhesive 36 in the longitudinal direction of the base portion 27. Both ends of the base portion 27 in the longitudinal direction may be fixed to the base substrate 31.

The base portion 27 has a rotationally symmetrical shape centered on a center point P of the vibrating substrate 21 when seen from the Z-axis direction (in other words, when seen in the plan view). Thus, the entire of the vibrating substrate 21 can be in a rotationally symmetrical shape. Accordingly, as described above, the resonator element 2 can be stably supported and fixed around the center.

In the embodiment, the width of the base portion 27 is substantially the same as that of each of the resonating arms 28 and 29. A portion (specifically, both end portions of the base portion 27 in the embodiment) of the base portion 27 can be vibrated according to two resonating arms 28 and 29. Thus, an effect (to have increasingly low frequencies or the like) can be exerted, which is the same as if the resonating arms 28 and 29 were increased in length. The width of the base portion 27 may be narrower than the width of each of the resonating arms 28 and 29 or wider than the width of each of the resonating arms 28 and 29. If the width of the base portion 27 is narrower than the width of each of the resonating arms 28 and 29, the vibration of the both end portions of the base portion 27 accompanying the two resonating arms 28 and 29 can be increased compared to if the width of the base portion 27 is the same as that of each of the resonating arms 28 and 29. Meanwhile, if the width of the base portion 27 is wider than the width of each of the resonating arms 28 and 29, the vibration of the both end portions of the base portion 27 accompanying the two resonating arms 28 and 29 can be suppressed compared to if the width of the base portion 27 is the same as that of each of the resonating arms 28 and 29.

The length of the base portion 27 in the Y-axis direction is not specifically limited so as not to contact the tip end portion (mass portions 281 and 291) of each of the resonating arms 28 and 29, however, in the embodiment, the length thereof is set substantially the same as or slightly shorter than a length that subtracts the length of the mass portion 281 or the mass portion 291 in the Y-axis direction from the entire length of the resonating arm 28 or the resonating arm 29 in the Y-axis direction.

The length of the base portion 27 in the X-axis direction is not specifically limited in so far that each of the resonating arms 28 and 29 is not contact the base portion 27 even though each of the resonating arms 28 and 29 is vibrated in a flexural manner, however the length thereof is preferred to be short as possible as in a view point that the dimensions of the resonator element 2 is suppressed in the X-axis direction. It is preferable that the angle that is formed by the longitudinal direction of the base portion 27 and the longitudinal direction (the Y-axis direction) of the resonating arms 28 and 29 is 45° or less.

The resonating arm (the first resonating arm) 28 is connected to one end portion (an end portion of left side in FIG. 2) of the base portion 27, while the resonating arm (the second resonating arm) 29 is connected to the other end portion (an end portion of right side in FIG. 2) of the base portion 27.

Two resonating arms 28 and 29 are arranged and extended in the Y-axis direction from the base portion 27 opposed to each other. More specifically, the resonating arm 28 is extended and arranged in +Y-axis direction from the base portion 27. The resonating arm 29 is extended and arranged in −Y-axis direction that is opposite to +Y-axis direction from the base portion 27.

The resonating arm 28 and the resonating arm 29 are arranged such that a base end portion of the resonating arm in one side and a middle portion (a portion between the tip end portion and the base end portion) of the resonating arm in the other side are parallel in the X-axis direction. In other words, the base end portion of the resonating arm 28 and the middle portion of the resonating arm 29 are parallel in the X-axis direction; and the base end portion of the resonating arm 29 and the middle portion of the resonating arm 28 are parallel in the X-axis direction.

As described above, the base portion 27 and the resonating arms 28 and 29 are arranged so that the distance of a gap between the resonating arm 28 and the resonating arm 29 in the X-axis direction can be suppressed and the resonating arm 28 and the resonating arm 29 can be prevented from colliding, even though the tip end portions of the resonating arm 28 and the resonating arm 29 are widened respectively. As a result, the dimensions of the resonator element 2 in the X-axis direction can be suppressed. The vibration of the resonator element 2 can also be increasingly low frequency.

The resonating arm 28 and the resonating arm 29 are arranged parallel in the X-axis direction to each other so that the dimensions of the resonator element 2 in the Y-axis direction can be prevented from increasing in size.

The resonating arms 28 and 29 have long shapes respectively, an end portion (a base end portion) of the base portion 27 side is a fixed end and an end portion (a tip end portion) that is opposite to the base portion 27 side is a free end.

The resonating arms 28 and 29 are formed having the same width to each other. Accordingly, when the resonating arms 28 and 29 are vibrated in opposite direction (in reverse phase) to each other, loss of the vibration can be small.

A mass portion (the first mass portion) 281 of which the width is larger than the base end portion of the resonating arm 28 in the X-axis direction is arranged at the tip end portion of the resonating arm 28. Similarly, a mass portion (the second mass portion) 291 of which the width is larger than the base end portion of the resonating arm 29 in the X-axis direction is arranged at the tip end portion of the resonating arm 29. A cross-sectional area of the mass portion 281 is larger than the base end portion of the resonating arm 28 and a cross-sectional area of the mass portion 291 is larger than the base end portion of the resonating arm 29. Thus, the weight of the tip end portion of the resonating arms 28 and 29 can be increased respectively. As a result, the lengths of the resonating arms 28 and 29 can be suppressed respectively and the dimensions of the resonator element 2 in the Y-axis direction can be suppressed. Also, the vibration frequencies of the resonating arms 28 and 29 can be lowered respectively.

The mass portions 281 and 291 have long shapes that are long in the X-axis direction respectively. Accordingly, the lengths of the resonating arms 28 and 29 can be suppressed respectively and the weights of the mass portions 281 and 291 can be increased respectively.

As shown in FIG. 3, a concavity 282 that is extended in the Y-axis direction is formed on the upper surface (main surface) of the resonating arm 28 and a concavity 283 that is extended in the Y-axis direction is formed on the lower surface (main surface) of the resonating arm 28. Thus, the cross-sectional surface of the resonating arm 28 has an H shape. The upper surface and the lower surface of the resonating arm 28 are surfaces of which the Z-axis direction is a normal line and opposed to each other. A pair of side surfaces of the resonating arm 28 is surface of which the X-axis direction is a normal line and opposed to each other.

Similarly, a concavity 292 that is extended in the Y-axis direction is formed on the upper surface (main surface) of the resonating arm 29 and a concavity 293 that is extended in the Y-axis direction is formed on the lower surface (main surface) of the resonating arm 29. Thus, the cross-sectional surface of the resonating arm 29 has an H shape. The upper surface and the lower surface of the resonating arm 29 are surfaces of which the Z-axis direction is a normal line and opposed to each other. A pair of side surfaces of the resonating arm 29 is surface of which the X-axis direction is a normal line and opposed to each other.

The shape of the cross-sectional surface of each of the resonating arms 28 and 29 is not limited to the above-described H shape and for example, may be a rectangular shape.

As shown in FIG. 3, an excitation electrode group 22 is arranged on the resonating arm 28 and an excitation electrode group 23 is arranged on the resonating arm 29.

The excitation electrode group 22 has a function that performs a vibration (excitation) of the resonating arm 28 in a flexural manner by applying electric current. The excitation electrode group 23 has a function that performs vibration (excitation) of the resonating arm 29 in a flexural manner by applying electric current.

As described above, the excitation electrode group 22 is constituted of an excitation electrode 221 that is arranged on the upper surface (more specifically, a wall portion of the concavity 282) of the resonating arm 28, an excitation electrode 222 that is arranged on the lower surface (more specifically, a wall portion of the concavity 283) of the resonating arm 28, an excitation electrode 223 that is arranged at a side surface of one side of the resonating arm 28 and an excitation electrode 224 that is arranged at a side surface of the other side of the resonating arm 28.

The excitation electrodes 221, 222, 223 and 224 are extended along the above described concavities 282 and 283 respectively.

Similarly, the excitation electrode group 23 is constituted of an excitation electrode 231 that is arranged on the upper surface (more specifically, a wall portion of the concavity 292) of the resonating arm 29, an excitation electrode 232 that is arranged on the lower surface (more specifically, a wall portion of the concavity 293) of the resonating arm 29, an excitation electrode 233 that is arranged at a side surface of one side of the resonating arm 29 and an excitation electrode 234 that is arranged at a side surface of the other side of the resonating arm 29.

The excitation electrodes 231, 232, 233 and 234 are extended along the above-described concavities 292 and 293 respectively.

The excitation electrodes 221, 222, 233 and 234 are electrically connected to a connection electrode 41 through a wiring (not shown) as described below. The excitation electrodes 223, 224, 231 and 232 are electrically connected to a connection electrode 42 through a wiring (not shown) as described below.

In the resonator element 2 constituted as the above description, when a voltage is applied between the connection electrode 41 and the connection electrode 42, the excitation electrodes 221, 222, 233 and 234 and the excitation electrodes 223, 224, 231 and 232 become reverse polarity so that the voltage of a direction that includes a component of the X-axis direction is applied to the resonating arms 28 and 29 respectively. Thus, each of the resonating arms 28 and 29 can perform vibration in a flexural manner with a constant frequency (the resonance frequency) due to a reverse piezoelectric effect of the piezoelectric material.

At this time, the resonating arms 28 and 29 perform vibration in a flexural manner in the opposite direction in the X-axis direction to each other.

As shown in FIGS. 4A and 4B, the resonating arm 28 and the resonating arm 29 perform vibration in a flexural manner in the same direction to each other. In other words, the resonating arm 28 and the resonating arm 29 are vibrated in a flexural manner so as to alternatively repeat a first state as shown in FIG. 4A, in which the tip end portion of the resonating arm 28 is flexed in a direction separating from the resonating arm 29 and the tip end portion of the resonating arm 29 is flexed in a direction approaching the resonating arm 28; and a second state as shown in FIG. 4B, in which the tip end portion of the resonating arm 28 is flexed in a direction of approaching to the resonating arm 29 and the tip end portion of the resonating arm 29 is flexed in a direction separating from the resonating arm 28. Accordingly, the vibration (leaked vibration) that is generated at the base portion 27 according to the vibration of each of the resonating arms 28 and 29 in a flexural manner can be cancelled out by each other. Accordingly, the vibration leakage can be suppressed. Specifically, a vibration (a rotational vibration) is suppressed, of which the entire base portion 27 is reciprocally and periodically rotated around a predetermined shaft according to the vibration of each of the resonating arms 28 and 29 in a flexural manner.

When each of the resonating arms 28 and 29 is vibrated in a flexural manner, the voltage having a constant frequency is generated by the piezoelectric effect of the piezoelectric body between the connection electrodes 41 and 42. The resonator element 2 can generate an electric signal that is vibrated in the resonance frequency using these properties.

The excitation electrode groups 22 and 23, the connection electrodes 41 and 42 and the wiring (not shown) can be formed by a metal material that is excellent in conductivity, such as aluminum, aluminum alloy, silver, silver alloy, gold, gold alloy, chrome, chrome alloy, and gold, respectively.

As a forming method of these electrodes, a physical film forming method such as a sputtering method and a vacuum vapor deposition method, a chemical vapor deposition method such as CVD, and various coating methods such as an ink jet method can be used.

Package

Next, description will be given regarding the package 3 that receives and fixes the resonator element 2.

As shown in FIG. 1, the package 3 has a plate shaped base substrate 31, a frame shaped frame member 32 and a plate shaped lid member 33. The base substrate 31, the frame member 32 and the lid member 33 are laminated in this order from the lower side to the upper side. The base substrate 31 and the frame member 32, and the frame member 32 and the lid member 33 are connected to each other by adhesive or brazing filler material. Thus, the package 3 accommodates the resonator element 2 in an inner space S partitioned by the base substrate 31, the frame member 32 and the lid member 33. Also, an electronic device that drives the resonator element 2 or the like can be accommodated within the package 3 besides the resonator element 2.

As the constituent material of the base substrate 31, it is preferable to have insulation property (non-conductivity), for example, various types of glass, various types of ceramic materials such as oxide ceramics, nitride ceramics or carbide ceramics, and various types of resin material such as polyimide can be used.

As the constituent material of the frame member 32 and the lid member 33, for example, the same material as the base substrate 31, various types of metal material such as Al or Cu, various types of glass or the like can be used. Specifically, as the constituent material of the lid member 33, if a material that has light transmittance such as glass material is used, when a metal coating portion (not shown) is formed at the resonator element 2 beforehand, even though the laser irradiates the metal coating portion through the lid member 33 after the resonator element 2 is accommodated in the package 3, the metal coating portion is removed and then the weight of the resonator element 2 is decreased (by a weight decreasing method) so that the frequency adjustment of the resonator element 2 can be performed.

A pair of mount electrodes 35a and 35b is formed on the upper surface of the base substrate 31 so as to expose to the inner space S. A conductive adhesive 36 such as epoxy-based, polyimide-based and silicon-based including conductive particles is coated (covered) on the mount electrode 35a. The resonator element 2 is loaded on the conductive adhesive 36. Thus, the resonator element 2 (the base portion 27) is reliably fixed to the electrode 35a (the base substrate 31).

The fixing is performed with the resonator element 2 being loaded on the conductive adhesive 36 so that the conductive adhesive 36 is coming into contact to the connection electrode 41 of the resonator element 2. Thus, the resonator element 2 is fixed to the base substrate 31 through the conductive adhesive 36; and the connection electrode 41 and the electrode 35a are electrically connected through the conductive adhesive 36.

The conductive adhesive 36 is positioned near the center of gravity of the resonator element 2 when seen from the Z-axis direction. Accordingly, the resonator element 2 can be stably fixed to the package 3 even if the resonator element 2 is partially fixed to the package 3 in the Y-axis direction.

The electrode 35b is electrically connected to the connection electrode 42 through a metal wire (bonding wire) 37 that is formed by for example, a wire bonding technique.

Four outer terminals 34a, 34b, 34c and 34d are arranged at the lower surface of the base substrate 31.

The outer terminals 34a and 34b out of these four outer terminals 34a to 34d are hot terminals that are electrically connected to the electrodes 35a and 35b through a conductive post (not shown) that is arranged at the via hole that is formed in the base substrate 31 respectively. The other two outer terminals 34c and 34d are dummy terminals for increasing the bonding strength and uniformizing the distance between the package 3 and the mounting substrate respectively when the package 3 is mounted on the mounting substrate.

As described above, the electrodes 35a and 35b and the outer terminals 34a to 34d can be formed for example, with gold coating at the underlying layer of tungsten and nickel plating respectively.

The electrode 35a and the connection electrodes 41 may be electrically connected through a metal wire (bonding wire) formed, for example by a wire bonding technique. In this case, the resonator element 2 can be fixed to the base substrate 31 through an adhesive that does not have conductivity, instead of the conductive adhesive 36. In a case where electronic components are accommodated in the package 3, if necessary, a writing terminal that is to perform a rewrite (adjustment) of a characteristic inspection of the electronic components or various types of information (for example, the temperature compensating information of the resonator device) within the electronic components may be formed on the lower surface of the base substrate 31.

According to the first embodiment as described above, two resonating arms 28 and 29 are extended from the base portion 27 in opposite direction to each other; and the base end portion of one side of resonating arm and the middle portion of the other side of resonating arm are parallel in the X-axis direction so that the separation distance between the resonating arm 28 and the resonating arm 29 in the X-axis direction can be suppressed; and the resonating arm 28 and the resonating arm 29 are prevented from colliding even though the tip end portions of the resonating arm 28 and the resonating arm 29 are widened respectively. As a result, the dimensions of the resonator element 2 in the X-axis direction can be suppressed.

Also, the resonating arm 28 and the resonating arm 29 are arranged in parallel to the X-axis direction to each other so that the dimensions of the resonator element 2 in the Y-axis direction can be prevented from increasing in size.

The resonator element 2 can be supported and fixed at the center thereof or near the center of gravity thereof. Thus, the mounting area of the resonator element 2 can be small and also in this point, miniaturization can be realized.

Also, regarding the resonator device 1 that accommodates the resonator element 2 within the package 3, the resonator device 1 can realize increasingly low frequencies and increasing miniaturization.

Second Embodiment

Next, the second embodiment of the resonator device according to the invention will be described.

Figure 5:
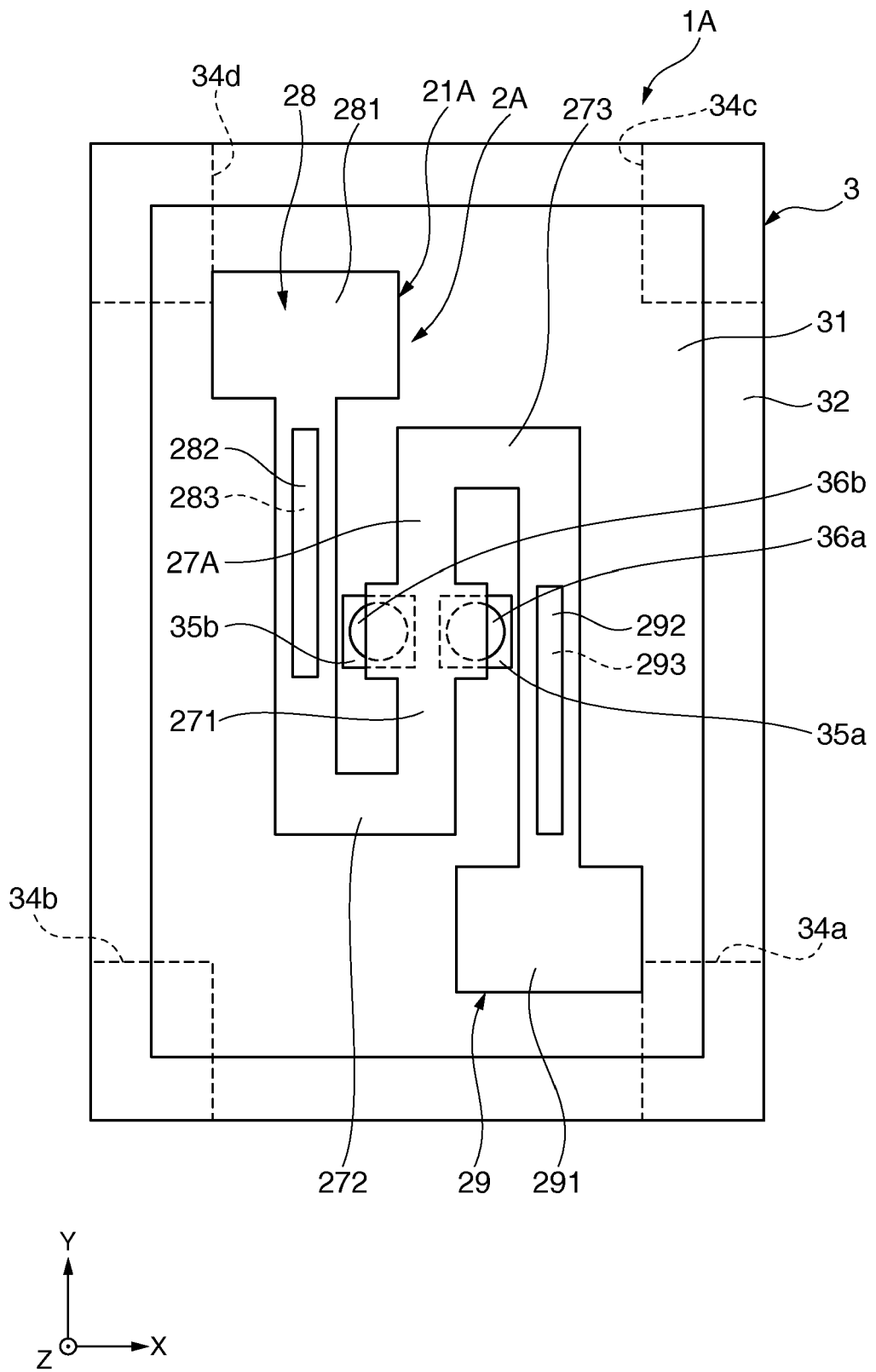
FIG. 5 is a top plan view illustrating the resonator device of according to a second embodiment of the invention.

FIG. 5 is a top plan view illustrating the resonator device of a second embodiment according to the invention.

Hereinafter, description will be given regarding the resonator device of the second embodiment focused on differences from the above described embodiment and description of identical items will not be repeated.

The resonator device of the second embodiment is similar to that of the first embodiment except that the constitution of the base portion of the resonator element is different. Also, in FIG. 5, the constituent elements similar to those of above described embodiment are given similar reference numbers.

A resonator device 1A of the embodiment has a resonator element 2A that is accommodated within the package 3 as shown in FIG. 5.

The resonator element 2A has a vibrating substrate 21A, and excitation electrode groups and connection electrodes (not shown) are arranged on the vibrating substrate 21A.

The vibrating substrate 21A has a base portion 27A and two (a pair of) resonating arms 28 and 29.

The base portion 27A is constituted of a main body portion 271 and a pair of connection portions 272 and 273.

The main body portion 271 is has a long shape that extends in the Y-axis direction. A pair of connection electrodes (not shown) is arranged on the lower surface of the main body portion 271 at the center portion thereof in the longitudinal direction. Thus, the center portion of the main body portion 271 in the longitudinal direction is fixed at the base substrate 31 of the package 3 through a pair of conductive adhesive 36a and 36b. Also, both ends of the main body portion 271 in the longitudinal direction may be fixed at the base substrate 31.

A pair of electrodes 35a and 35b is formed on the upper surface of the base substrate 31 so as to expose to the inner space S. Conductive adhesive 36a and 36b such as epoxy-based and polyimide-based including conductive particles are coated on (cover) the electrodes 35a and 35b. The resonator element 2 is loaded on the conductive adhesive 36a and 36b.

The fixing is performed with the resonator element 2 being loaded on the conductive adhesive 36a and 36b so that the conductive adhesive 36a and 36b contact a pair of connection electrodes of the resonator element 2A.

In the embodiment, the width of the main body portion 271 is substantially the same as that of each of the resonating arms 28 and 29. Accordingly, a portion (specifically, both end portions of the main body portion the main body portion 271 in the embodiment) of the main body portion 271 can be vibrated according to two resonating arms 28 and 29. Thus, an effect (having increasingly lower frequencies or the like) can be exerted, which is the same as that the resonating arms 28 and 29 are to be elongated. The width of the main body portion 271 may be narrower than the width of each of the resonating arms 28 and 29 or wider than the width of each of the resonating arms 28 and 29. If the width of the main body portion 271 is narrower than the width of each of the resonating arms 28 and 29, the vibration of the both end portions of the main body portion 271 accompanying the two resonating arms 28 and 29 can be increased compared to if the width of the main body portion 271 is the same as that of each of the resonating arms 28 and 29. Meanwhile, if the width of the main body portion 271 is wider than the width of each of the resonating arms 28 and 29, the vibration of the both end portions of the main body portion 271 accompanying the two resonating arms 28 and 29 can be suppressed compared to if the width of the main body portion 271 is the same as that of each of the resonating arms 28 and 29.

The length of the main body portion 271 in the Y-axis direction is not specifically limited so as not to contact the tip end portion (mass portions 281 and 291) of each of the resonating arms 28 and 29, and in the embodiment, the length thereof is set substantially the same as or slightly shorter than a length that subtracts the length of the mass portion 281 or the mass portion 291 in the Y-axis direction from the entire length of the resonating arm 28 or the resonating arm 29 in the Y-axis direction.

The connection portion (the first connection portion) 272 is connected to one end portion (an end portion of upper side in FIG. 5) of the main body portion 271, while the connection portion (the second connection portion) 272 is connected to one end portion (an end portion of lower side in FIG. 5) of the main body portion 271.

The connection portion 272 is extended in the X-axis direction (left side in FIG. 5) from one end portion of the main body portion 271. Meanwhile, the connection portion 273 is extended in the X-axis direction (right side in FIG. 5) from the other end portion of the main body portion 271.

In the embodiment, a width of each of the connection portions 272 and 273 is substantially the same as that of each of the resonating arms 28 and 29. Accordingly, the connection portions 272 and 273 can be vibrated according to two resonating arms 28 and 29. Thus, an effect (having increasingly lower frequencies or the like) can be exerted, which is the same as that the resonating arms 28 and 29 are to be elongated. The width of each of the connection portions 272 and 273 may be narrower than the width of each of the resonating arms 28 and 29 or wider than the width of each of the resonating arms 28 and 29. If the width of each of the connection portions 272 and 273 is narrower than the width of each of the resonating arms 28 and 29, the vibration of each of the connection portions 272 and 273 accompanying the two resonating arms 28 and 29 can be increased compared to if the width of each of the connection portions 272 and 273 is the same as that of each of the resonating arms 28 and 29. Meanwhile, if the width of each of the connection portions 272 and 273 is wider than the width of each of the resonating arms 28 and 29, the vibration of each of the connection portions 272 and 273 accompanying the two resonating arms 28 and 29 can be suppressed compared to if the width of each of the connection portions 272 and 273 is the same as that of each of the resonating arms 28 and 29.

The length of each of the connection portions 272 and 273 in the X-axis direction is not specifically limited so as not to contact the main body portion 271, however the length thereof is preferred to be short as possible as in a view point that the dimensions of the resonator element 2A is suppressed in the X-axis direction.

The resonating arm 28 is connected to the connection portion 272 of the base portion 27A while the resonating arm 29 is connected to the connection portion 273.

The resonating arm 28 is extended to the upper side from the connection portion 272 in the Y-axis direction, while the resonating arm 29 is extended to the lower side from 273 in the Y-axis direction. Thus, a pair of resonating arms 28 and 29 is opposed to each other through the main body portion 271. Also, a pair of resonating arms 28 and 29, and the main body portion 271 are arranged so as to be parallel to each other.

According to the resonator element 2A, the resonating arm 28 is extended from the connection portion 272 that is extended in the X-axis direction from one end portion of the main body portion 271 in the Y-axis direction. The resonating arm 29 is extended from the connection portion 273 that is extended in the X-axis direction opposite to the connection portion 272 from the other end portion of the main body portion 271 in the Y-axis direction. Thus, influence of the shape of the base portion 27A with respect to the vibration characteristic of the resonating arms 28 and 29 can be suppressed. Accordingly, the vibration characteristic of the resonator element 2A can be excellent and the design of the resonator element 2A can be easily performed. In other words, the base portion 27A is constituted of a portion that is extended in the Y-axis direction and a portion that is extended in the X-axis direction so that the shape thereof is nearly unaffected with respect to the vibration characteristics of the resonating arms 28 and 29, and assumption can be easily made even though influence is present.

According to the above-described second embodiment, effect of the same as that of the first embodiment can be made.

Third Embodiment

Next, the third embodiment of the resonator device according to the invention will be described.

Figure 6:
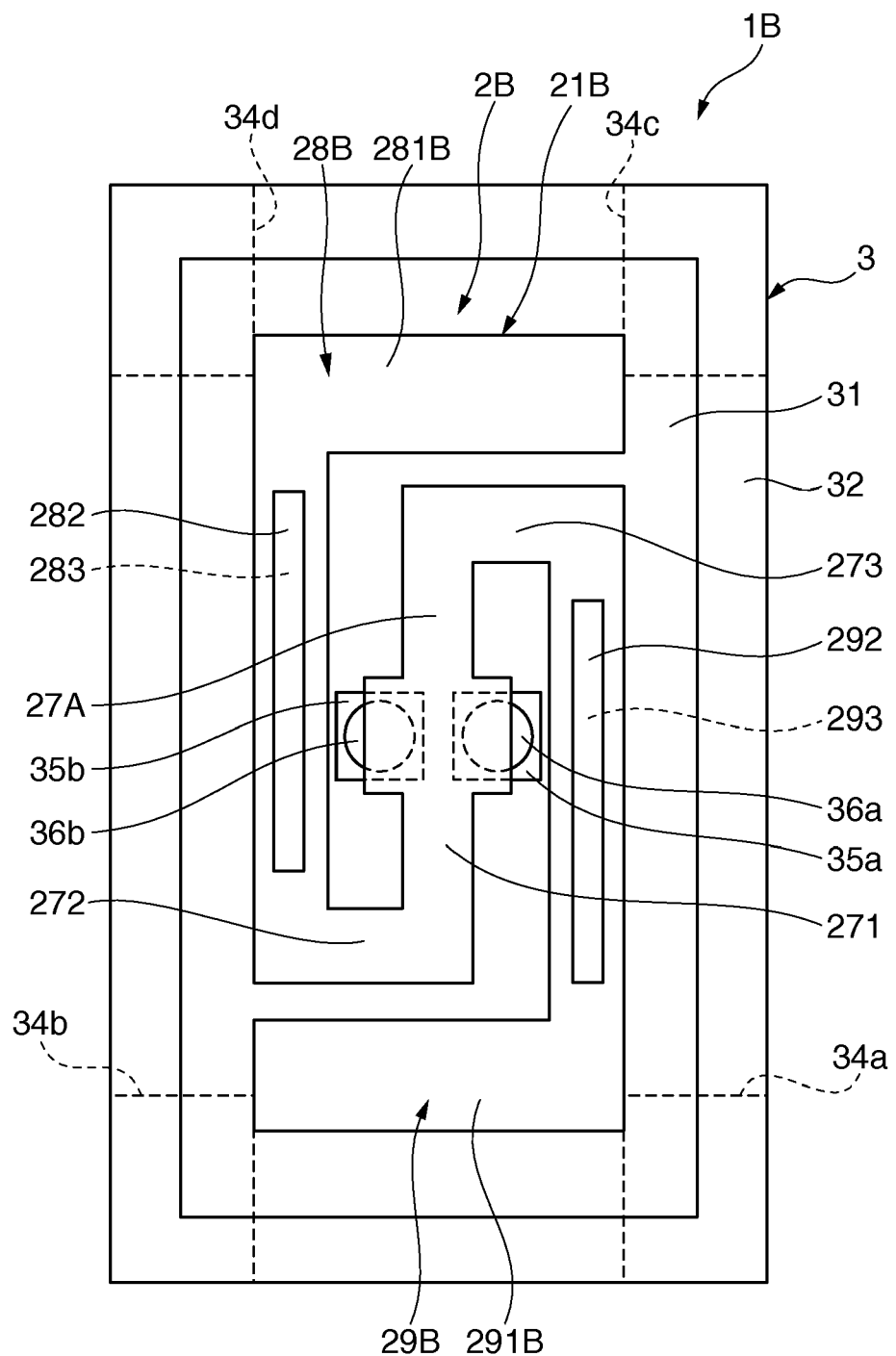
FIG. 6 is a top plan view illustrating the resonator device of according to a third embodiment of the invention.

FIG. 6 is a top plan view illustrating the resonator device of a third embodiment according to the invention.

Hereinafter, description will be given regarding the resonator device of the third embodiment focused on difference from the above described embodiment and the same articles thereof will not be described repeatedly.

The resonator device of the third embodiment is substantially the same as that of the first embodiment except that the constitution of the base portion and the shape of the tip end portion of each of resonating arms are different. Also, the resonator device of the third embodiment is substantially the same as that of the second embodiment except that the shapes of the tip end portion of each of resonating arms are different. In FIG. 6, the constituent elements similar to those of above described embodiment are given similar reference numbers.

A resonator device 1B of the embodiment has a resonator element 2B that is accommodated within the package 3 as shown in FIG. 6.

The resonator element 2B has a vibrating substrate 21B, and excitation electrode groups and connection electrodes (not shown) are arranged on the vibrating substrate 21B.

The vibrating substrate 21B has the base portion 27A and two (a pair of) resonating arms 28B and 29B.

The base portion 27A is constituted of the main body portion 271 and a pair of connection portions 272 and 273 as similar to the base portion 27A of the second embodiment.

A resonating arm 28B is connected to the connection portion 272 of the base portion 27A while a resonating arm 29B is connected to the connection portion 273.

A mass portion (the first mass portion) 281B of which the width is larger than the base end portion of the resonating arm 28B in the X-axis direction is arranged at the tip end portion of the resonating arm 28B. Similarly, a mass portion (the second mass portion) 291B of which the width is larger than the base end portion of the resonating arm 29B in the X-axis direction is arranged at the tip end portion of the resonating arm 29B. A cross-sectional area of the mass portion 281B is larger than the base end portion of the resonating arm 28B and a cross-sectional area of the mass portion 291B is larger than the base end portion of the resonating arm 29B. Thus, the weight of the tip end portion of the resonating arms 28B and 29B can be increased respectively. As a result, the lengths of the resonating arms 28B and 29B can be suppressed respectively and the dimensions of the resonator element 2B in the Y-axis direction can be suppressed. Also, the vibration frequencies of the resonating arms 28B and 29B can be lowered respectively.

The mass portions 281B and 291B have long shapes those are long in the X-axis direction respectively. Accordingly, the lengths of the resonating arms 28B and 29B can be suppressed respectively and the weights of the mass portions 281B and 291B can be increased respectively.

Specifically, in the pair of mass portions 281B and 291B of the embodiment, both end portions thereof are arranged parallel to each other in the Y-axis direction. In other words, as shown in FIG. 6, the mass portion 281B is formed so as to project from the right side surface (side surface of the resonating arm 29) of the resonating arm 28B while the mass portion 291B is formed so as to project from the left side surface (side surface of the resonating arm 28) of the resonating arm 29B. Thus, the mass portion 281B is formed so as not to project from the left side surface (side surface of opposite to the resonating arm 29) of the resonating arm 28B and the mass portion 291B is formed so as not to project from the right side surface (side surface of opposite to the resonating arm 28) of the resonating arm 29B. Accordingly, the dimensions of the resonator element 2B in the X-axis direction can be suppressed even though the width of the mass portions 281B and 291B is large respectively.

Also, the mass portion 281B may be formed so as to project from the left side surface (side surface of opposite to the resonating arm 29) of the resonating arm 28B and the mass portion 291B may be formed so as to project from the right side surface (side surface of opposite to the resonating arm 28) of the resonating arm 29B. In this case, it is preferable that the mass portion 281B is formed such that the protrusion amount from the left side surface is smaller than that from the right side surface of the resonating arm 28B and it is preferable that the mass portion 291B is formed such that the protrusion amount from the right side surface is smaller than that from the left side surface of the resonating arm 29B in a view point that the dimensions of the resonator element 2B is suppressed in the X-axis direction.

According to the above-described third embodiment, effect of the same as that of the first embodiment can be made.

Fourth Embodiment

Figure 7:
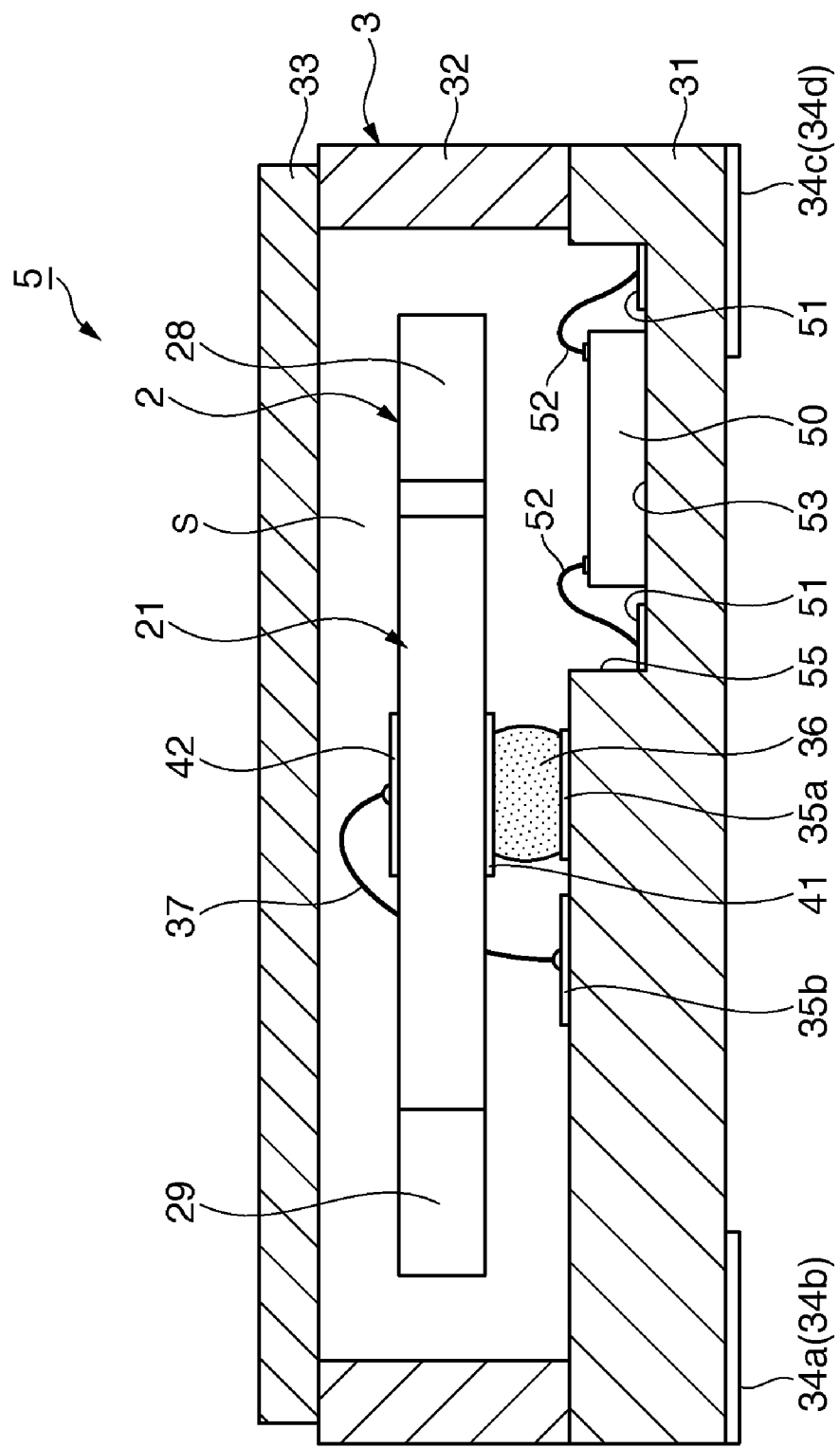
FIG. 7 is a cross-sectional view illustrating the resonator device of a fourth embodiment according to the invention.

Hereinafter, description will be given regarding a piezoelectric oscillator as the resonator device of a fourth embodiment according to the invention. FIG. 7 is a cross-sectional view illustrating the piezoelectric oscillator as the resonator device of the fourth embodiment. The X-axis, Y-axis and Z-axis are illustrated and they are used in the same manner as those of the above-described embodiments.

The piezoelectric oscillator 5 as the resonator device shown in FIG. 7, has the resonator element 2, a semiconductor element 50 as a driving circuit portion having a function that is electrically connected to the resonator element 2 and drives at least resonator element 2; and the package 3 that accommodates the resonator element 2 and the semiconductor element 50.

Hereinafter, each of portions that constituted of the piezoelectric oscillator 5 is described in detail in regular sequence. The constituent elements of the piezoelectric oscillator 5 that are similar to those of above described embodiments are given similar reference numbers and description thereof is omitted.

Vibrator Element

The resonator element 2 is similar to that of the first embodiment so that the description thereof is omitted. In the embodiment, the resonator element 2 is described as an example, however the resonator element 2A or the resonator element 2B may be used.

Package

Next, description will be given regarding the package 3 that receives and fixes the resonator element 2 and the semiconductor element 50.

As shown in FIG. 7, the package 3 has a plate shaped base substrate 31 and in which a concave portion 55 is formed, a frame shaped frame member 32 and a plate shaped lid member 33. The base substrate 31, the frame member 32 and the lid member 33 are laminated in this order from the lower side to the upper side. The base substrate 31 and the frame member 32, and the frame member 32 and the lid member 33 are connected to each other by adhesive or brazing filler material. Thus, the package 3 accommodates the resonator element 2 and the semiconductor element 50 in an inner space S partitioned by the base substrate 31, the frame member 32 and the lid member 33. Also, an electronic device that drives the resonator element 2 or the like can be accommodated within the package 3 includes the resonator element 2 and the semiconductor element 50.

As the constituent material of the base substrate 31, it is preferable to have insulation property (non-conductivity), for example, various types of glass, various types of ceramic materials such as oxide ceramics, nitride ceramics or carbide ceramics, and various types of resin material such as polyimide can be used.

As the constituent material of the frame member 32 and the lid member 33, for example, the same material as the base substrate 31, various types of metal material such as Al or Cu, various types of glass or the like can be used. Specifically, as the constituent material of the lid member 33, if a material that has a light transmittance such as glass material is used, when a metal coating portion (not shown) is formed at the resonator element 2 beforehand, even though after the resonator element 2 is accommodated in the package 3, the laser irradiates the metal coating portion through the lid member 33, the metal coating portion is removed and then the weight of the resonator element 2 is decreased (by a weight decreasing method) so that frequency adjustment of the resonator element 2 can be performed.

A pair of mount electrodes 35a and 35b is formed on the upper surface of the base substrate 31 so as to expose to the inner space S. A conductive adhesive 36 such as an epoxy-based, polyimide-based and silicon-based including conductive particles is coated on (cover) the mount electrode 35a. The resonator element 2 is loaded on the conductive adhesive 36. Thus, the resonator element 2 (the base portion 27) is reliably fixed to the electrode 35a (the base substrate 31).

The fixing is performed with the resonator element 2 being loaded on the conductive adhesive 36 so that the conductive adhesive 36 is contacted to the connection electrode 41 of the resonator element 2. Thus, the resonator element 2 is fixed to the base substrate 31 through the conductive adhesive 36; and the connection electrode 41 and the electrode 35a are electrically connected through the conductive adhesive 36.

The conductive adhesive 36 is positioned near the center of gravity of the resonator element 2 when seen from the Z-axis direction. Accordingly, the resonator element 2 can be stably fixed to the package 3 even if the resonator element 2 is partially fixed to the package 3 in the Y-axis direction.

The electrode 35b is electrically connected to the connection electrode 42 through a metal wire (bonding wire) 37 that is formed by for example, a wire bonding technique.

The concave portion 55 that has a concave bottom surface 53 around which wall surface is formed is arranged at the base substrate 31. A plurality of lead electrodes 51 is formed at the concave bottom surface 53. The semiconductor element 50 is connected to a plurality of lead electrodes 51 through a metal bump 52. The semiconductor element 50 and the lead electrode 51 are electrically connected through a metal wire (bonding wire) that is formed by for example, a wire bonding technique.

The lead electrode 51 and the mount electrodes 35a and 35b are electrically connected to each other with a circuit wiring (not shown).

Four outer terminals 34a, 34b, 34c and 34d are arranged at the lower surface of the base substrate 31.

These four outer terminals 34a, 34b, 34c and 34d are hot terminals that are electrically connected to the circuit wiring (not shown) through a conductive post (not shown) that is arranged at the via hole that is formed in the base substrate 31 respectively. Any one of the terminals 34a to 34d may be a dummy terminal for increasing the bonding strength and uniformizing the distance between the package 3 and the mounting substrate respectively when the package 3 is mounted on the mounting substrate.

As described above, the electrodes 35a and 35b, the lead electrode 51 and the outer terminals 34a to 34d can be formed for example, with gold coating at the underlying layer of tungsten and nickel plating respectively.

The electrode 35a and the connection electrodes 41 may be electrically connected through a metal wire (bonding wire) formed, for example by a wire bonding technique. In this case, the resonator element 2 can be fixed to the base substrate 31 through adhesive that does not have conductivity, instead of the conductive adhesive 36. In a case where the electronic components are accommodated within the package 3, if necessary, a writing terminal that is to perform a rewrite (adjustment) of a characteristic inspection of the electronic components or various types of information (for example, the temperature compensating information of the resonator device) within the electronic components may be formed on the lower surface of the base substrate 31.

According to the fourth embodiment as described above, two resonating arms 28 and 29 are extended from the base portion 27 in opposite direction to each other; and the base end portion of one side of resonating arm and the middle portion of the other side of resonating arm are parallel in the X-axis direction so that the separation distance between the resonating arm 28 and the resonating arm 29 in the X-axis direction can be suppressed; and the resonating arm 28 and the resonating arm 29 are prevented from colliding even though the tip end portions of the resonating arm 28 and the resonating arm 29 are widened respectively. As a result, the dimensions of the resonator element 2 in the X-axis direction can be suppressed.

Also, the resonating arm 28 and the resonating arm 29 are arranged in parallel to the X-axis direction to each other so that the dimensions of the resonator element 2 in the Y-axis direction can be prevented from increasing in size.

The resonator element 2 can be supported and fixed at the center thereof or near the center of weight thereof. Thus, the mounting area of the resonator element 2 can be small and also in this point, miniaturization can be realized.

Also, regarding the piezoelectric oscillator 5 as the resonator device that accommodates the resonator element 2 within the package 3, the piezoelectric oscillator can achieve increasingly lower frequencies and increasing miniaturization.

The resonator device of each of the above-described embodiments can be applied to various types of electronic devices and the applied electronic device is compact in size and has high reliability.

Electronic Device

The resonator device of each of the above-described embodiments can be applied to various types of electronic devices and the obtained electronic device has a high reliability. A piezoelectric vibrator may be used instead of the piezoelectric oscillator that is described in the above embodiments can be used in the electronic device. If the piezoelectric vibrator is used, a driving circuit portion (not shown) that is electrically connected to the resonator element is arranged.

Figure 8:
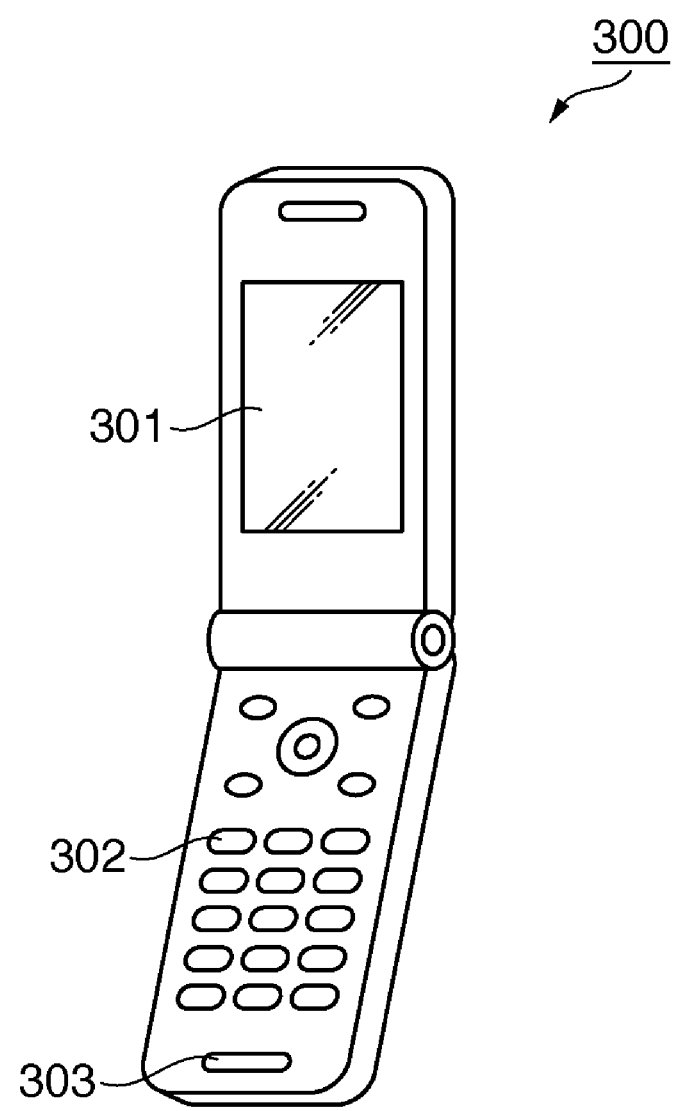
FIG. 8 is a perspective view schematically illustrating a cellular phone as an example of the electronic device according to the invention.
Figure 9:
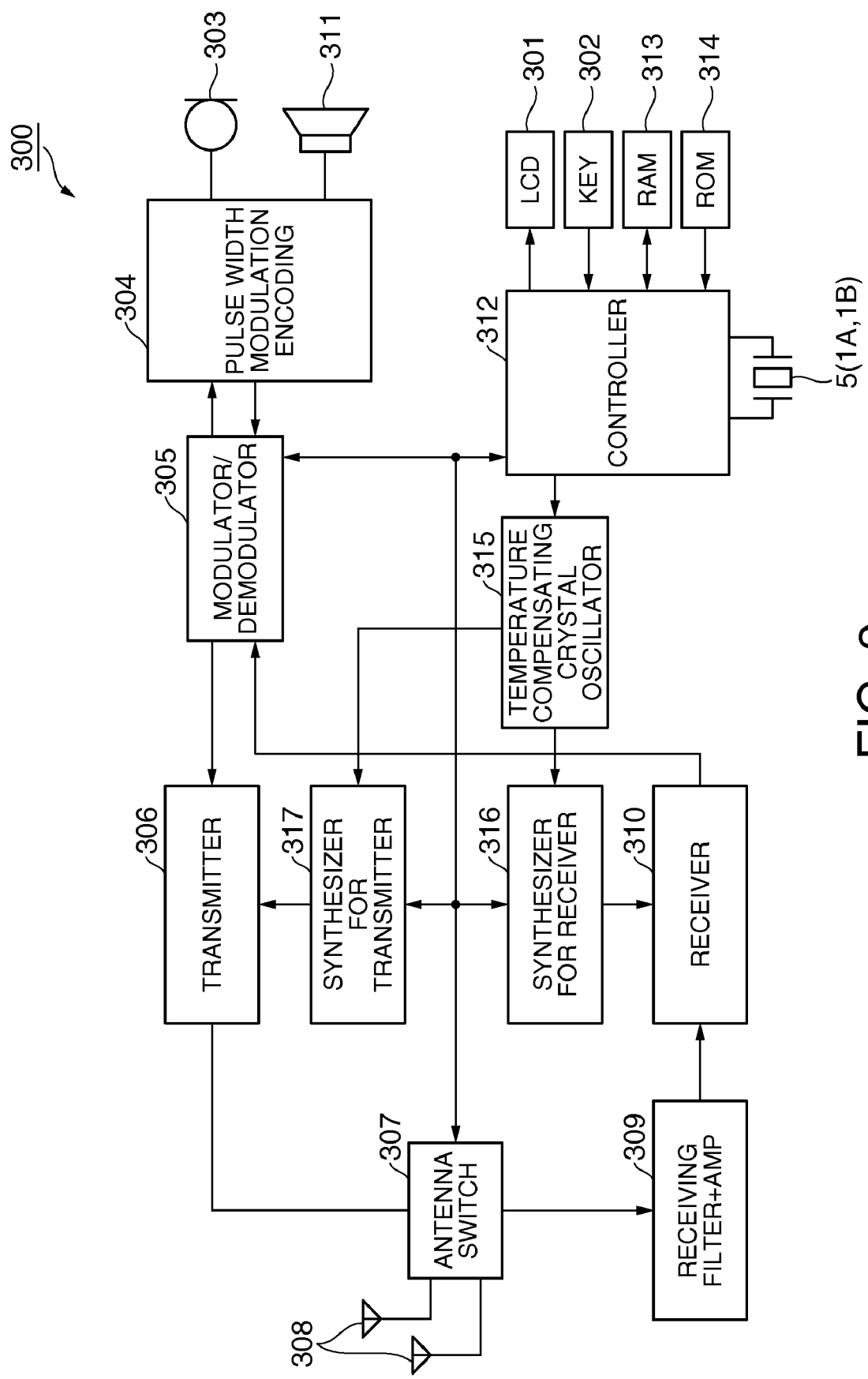
FIG. 9 is a circuit block diagram of the cellular phone as an example of the electronic device according to the invention.

FIGS. 8 and 9 illustrate a cellular phone as an example of the electronic device according to the invention. FIG. 8 is a perspective view schematically illustrating the outer shape of the cellular phone and FIG. 9 is a circuit block diagram illustrating a circuit constitution of the cellular phone.

The cellular phone 300 can uses above-described resonator element 2, 2A and 2B (the resonator element 2 is described representatively, here in below) or the piezoelectric oscillator 5, 1A and 1B (the piezoelectric oscillator 5 is described representatively, here in below) that use the resonator element 2. In this embodiment, an example is described, which uses the resonator element 2. The constitution and operation of the resonator element 2 are given similar reference numbers and the description thereof is omitted.

As shown in FIG. 8, the cellular phone 300 includes a LCD (Liquid Crystal Display) 301 that is display portion, a key 302 that is an input portion such as numbers, a microphone 303, a speaker 311, a circuit portion (not shown) and the like.

As shown in FIG. 9, in a case where transmittance is performed in the cellular phone 300, when the user inputs their own voice to the microphone 303, a signal is transmitted from an antenna 308 via a pulse width modulation-encoding block 304 and a modulator/demodulator block 305 and through a transmitter 306 and an antenna switch 307.

Meanwhile, a signal that is transmitted from a telephone of other people is received from the antenna 308 and input to the modulator/demodulator block 305 from a receiver 310 via the antenna switch 307 and a receiving filter 309. Thus, the modulated or demodulated signal is output to a speaker 311 as a voice via the pulse width modulation-encoding block 304.

A controller 312 is arranged to control the antenna switch 307, the modulator/demodulator block 305 or the like.

The controller 312 is required to be precise so as to also control the LCD 301 other than the above-described display portion, key 302 that is the input portion of the numbers or the like, a RAM 313 or a ROM 314. There is also a need for miniaturization of the cellular phone 300.

The above described resonator element 2 is used to meet the need.

The cellular phone 300 also includes a temperature compensating crystal oscillator 315, a synthesizer 316 for the receiver, a synthesizer 317 for the transmitter or the like as other constituent blocks, however the description thereof is omitted.

The resonator element 2 that is used in the cellular phone 300 can be also compact even in the low frequency band as described above.

Furthermore, regarding the piezoelectric oscillator 5 that accommodates the resonator element 2 within the package 3, the piezoelectric oscillator can achieve increasingly lower frequencies and increasing miniaturization.

Accordingly, the electronic device (the cellular phone 300) that uses the resonator element 2 or the piezoelectric oscillator 5 can decrease the mounting region and be compact in size.

Figure 10:
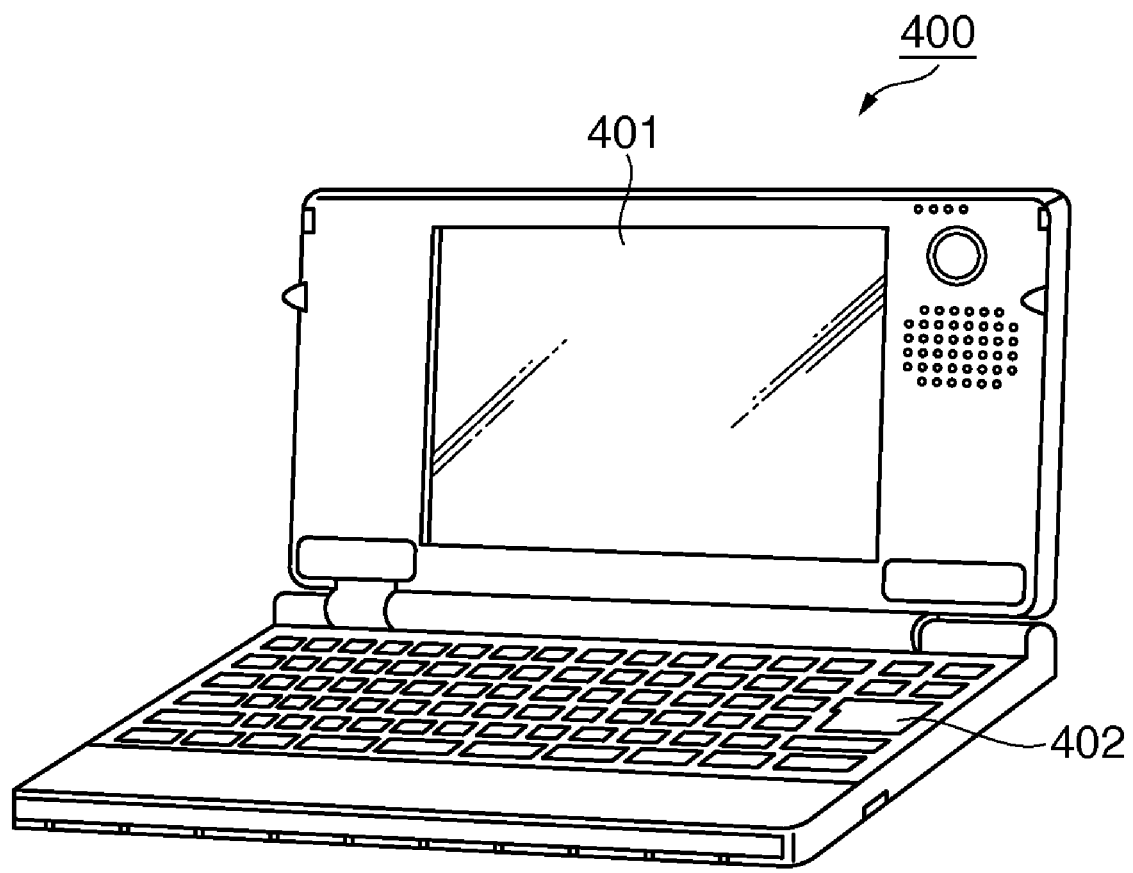
FIG. 10 is a perspective view schematically illustrating a personal computer as an example of the electronic device according to the invention.

As the electronic device including the resonator element 2 according to the invention, there is a personal computer (a mobile type personal computer) 400 as shown in FIG. 10. The personal computer 400 includes a display portion 401, an input key portion 402 or the like, and uses the piezoelectric oscillator 5 using the above described resonator element 2 as the reference clock of the electric control.

The electronic devices including the piezoelectric oscillator 5 according to the invention, besides above-described examples, includes for example, digital-still cameras, ink jet ejection apparatuses (for example, ink jet printers), laptop personal computers, televisions, vides cameras, video tape recorders, car navigation apparatuses, pagers, electronic notebooks (including ones with communication capabilities), electronic dictionaries, calculators, electronic game machines, word processors, work stations, television phones, surveillance TV monitors, electronic binoculars, POS terminals, medical devices (for example, electronic thermometers, sphygmomanometers, blood glucose meters, electrocardiogram measuring systems, ultrasonic diagnosis devices, and electronic endoscopes), fish finders, various measurement instruments, various indicators (for example, indicators used in vehicles, airplanes, and ships), flight simulators, and the like.

Meanwhile the resonator element and resonator device according to the invention has been described based on the embodiment illustrated in the drawings, the invention is not limited to the embodiments; the configuration of the respective portions can be replaced with any configuration having the same function. Moreover, other arbitrary constituent elements may be added the invention. The invention may combine an arbitrary two or more constituents (characteristics) of each of the embodiments.

For example, in the above-described embodiments, the description has been given in a case where the resonator element has two resonating arms, however the number of the resonating arms may be three or more.

Furthermore, in the above described embodiments, description have been given in which each of the resonating arms is constituted of the piezoelectric body and the electric current is applied to the excitation electrode that is arranged on each of resonating arms so that each of the resonating arms is excited, however the invention is not limited thereto and for example, a constitution may be included in which a piezoelectric body element where an electrode layer, a piezoelectric body layer and a electrode layer are laminated in this order on each of the resonating arms is arranged and the piezoelectric body element is extended and contracted so that the resonating arms are vibrated.

Also, the resonator device of the invention may be applied to a gyro sensor or the like, in addition to piezoelectric oscillators such as a crystal oscillator (SPXO), a voltage-controlled crystal oscillator (VCXO), a temperature-compensated crystal oscillator (TCXO) or an oven-controlled crystal oscillator (OCXO).

The entire disclosure of Japanese Patent Application Nos: 2010-063875, filed Mar. 19, 2010 and 2011-005564, filed Jan. 14, 2011 are expressly incorporated by reference herein.

What is claimed is:

1. A resonator element comprising:
   a base that has a base center, a first base extension and a second base extension,
   a first resonating arm that extends from the first base extension at a first arm end in a first direction and that is provided at one side of the base center, and
   a second resonating arm that extends from the second base extension at a second arm end in a second direction opposite to the first direction and that is provided at another side opposite to the one side of the base center, wherein
   the second arm end and a first middle area of the first resonating arm are arranged on a first line perpendicular to both the first and second directions,
   the first arm end and a second middle area of the second resonating arm are arranged on a second line parallel to the first line,
   the first base extension extends in a third direction inclined relative to the second direction and the second line, respectively, and the second base extension extends in a fourth direction inclined relative to the first direction and the first line, respectively.

2. The resonator element according to claim 1, further comprising:
a first mass having a first mass width that is arranged at a first tip of the first resonating arm having a first arm width, and
a second mass having a second mass width that is arranged at a second tip of the second resonating arm having a second arm width, wherein
the first mass width is wider than the first arm width, and the second mass width is wider than the second arm width.

3. The resonator element according to claim 2, wherein
a first mass cross-sectional area of the first mass is larger than a first arm cross-sectional area of the first resonating arm, and a second mass cross-sectional area of the second mass is larger than a second arm cross-sectional area of the second resonating arm.

4. The resonator element according to claim 3, wherein
the first mass is in a first longitudinal rectangular shape in which first sides of the first mass are longer than second sides of the first mass, and the first sides are perpendicular to the first direction, and
the second mass is in a second longitudinal rectangular shape in which third sides of the second mass are longer than fourth sides of the second mass, and the third sides are perpendicular to the second direction.

5. The resonator element according to claim 4, wherein
the second sides are parallel to each other in the first direction, and the fourth sides are parallel to each other in the second direction.

6. The resonator element according to claim 1, wherein
the first base extension extends from the base center toward the first arm end in the third direction, and
the second base extension extends from the base center toward the second arm end in the fourth direction.

7. The resonator element according to claim 1, wherein
the first resonating arm and the second resonating arm are vibrated in a flexural manner in fifth and sixth directions that are substantially perpendicular to the first and second directions, respectively.

8. The resonator element according to claim 7, wherein
the first resonating arm and the second resonating arm are vibrated in a flexural manner in either the fifth direction or the sixth direction at the same time.

9. The resonator element according to claim 1, wherein
the base has a rotationally symmetrical shape with respect to the base center.

10. A resonator device comprising:
the resonator element according to claim 1, and
a package that accommodates the resonator element.

11. A resonator device comprising:
the resonator element according to claim 1,
a driving circuit portion that is electrically connected to the resonator element, and
a package that accommodates the resonator element.

12. An electronic device comprising:
the resonator element according to claim 1.

13. A resonator element comprising:
a first resonating arm extending in a first direction to a first distal end;
a second resonating arm parallel to and laterally offset from the first resonating arm, the second resonating arm extending in a second direction opposite to the first direction to a second distal end;
a base located adjacent to a first middle portion of the first resonating arm and adjacent to a second middle portion of the second resonating arm;
a first base extension interconnecting the base with a first proximal end of the first resonating arm, the first base extension extending in a third direction from the base;
a second base extension interconnecting the base with a second proximal end of the second resonating arm, the second base extension extending in a fourth direction from the base, and wherein
the third direction is a be fourth direction.

14. The resonator element according to claim 13, wherein
the first base extension extends in the third direction inclined relative to the second direction, and
the second base extension extends in the fourth direction inclined relative to the first direction.

15. The resonator element according to claim 13, wherein
the first resonating arm and the second resonating arm are vibrated in a flexural manner in either fifth or sixth directions at the same time, the fifth and sixth directions are substantially perpendicular to the first and second directions, respectively.

16. The resonator element according to claim 13, further comprises
a first mass having a first mass width that is arranged at the distal end of the first resonating arm, and
a second mass having a second mass width that is arranged at the second distal end of the second resonating arm, wherein
the first mass width is wider than the first resonating arm, and the second mass width is wider than the second resonating arm.

17. The resonator element according to claim 16, wherein
a first mass cross-sectional area of the first mass is larger than a first arm cross-sectional area of the first resonating arm, and a second mass cross-sectional area of the second mass is larger than a second arm cross-sectional area of the second resonating arm.

18. The resonator element according to claim 17, wherein
the first mass is in a first longitudinal rectangular shape in which first sides of the first mass are longer than second sides of the first mass, and the first sides are perpendicular to the first direction, and
the second mass is in a second longitudinal rectangular shape in which third sides of the second mass are longer than fourth sides of the second mass, and the third sides are perpendicular to the second direction.

* * * * *